United States Patent
Kay et al.

[11] Patent Number: 6,161,765
[45] Date of Patent: Dec. 19, 2000

[54] OUTDOOR ENCLOSURE WITH HEATED DESICCANT

[75] Inventors: Jason Abraham Kay, Morristown; David Stevens Kerr, Morris Plains; John Robert Morris, Jr., Cranbury, all of N.J.; Ivan Pawlenko, Holland, Pa.; Richard Franklin Schwartz, Cranbury, N.J.

[73] Assignee: Lucent Technologies, Inc., Murray Hill, N.J.

[21] Appl. No.: 09/409,136

[22] Filed: Sep. 30, 1999

[51] Int. Cl.⁷ .......................................... F24F 7/00
[52] U.S. Cl. .............................. 236/49.3; 62/94; 165/233; 236/44 A; 236/44 E
[58] Field of Search ................. 236/49.3, 44 R, 236/44 A, 44 E; 62/94; 165/233

[56] References Cited

U.S. PATENT DOCUMENTS

| | | | |
|---|---|---|---|
| 4,620,248 | 10/1986 | Gitzendanner | 360/97 |
| 5,230,466 | 7/1993 | Moriya et al. | 236/44 A |
| 5,934,368 | 8/1999 | Tanaka et al. | 165/233 |

OTHER PUBLICATIONS

Desiccant–Desiccare Inc. Website—URL http:www.multisorb.com.
United Desiccants Website—URL http:www.uniteddesiccants.com.
Desiccare Inc. Website—URL's http:www.multisorb.com.

*Primary Examiner*—William Doerrler
*Assistant Examiner*—Marc Norman
*Attorney, Agent, or Firm*—Schnader Harrison Segal & Lewis LLP

[57] ABSTRACT

A protective enclosure for housing heat-generating electronics, having a sorption device for controlling humidity and a heater for heating the sorption device. The invention protects electronics placed within the enclosure from the effects of water vapor and condensation during normal operation and in the event of power loss. The sorption device adsorbs water vapor during normal operation or power loss when the temperature in the enclosure falls below the dew point. The sorption device releases collected water as water vapor when power is restored and the temperature in the enclosure rises above the dew point. The invention thereby prevents failure of the electronics due to condensation build-up and provides for effective long-term use of the sorption device.

7 Claims, 1 Drawing Sheet

OUTDOOR ENCLOSURE WITH HEATED DESICCANT

BACKGROUND OF THE INVENTION

1. Field of Invention

The present invention relates generally to protective enclosures for electronic circuitry.

2. Description of the Prior Art

Communication service providers are experiencing significant consumer demands to accommodate additional bandwidth and traffic capacity in existing and new communications systems. To satisfy this increasing demand, service providers have decentralized the location of equipment, added additional components, and upgraded services using improved electronics and related devices.

In decentralizing equipment, the electronics often reside at locations remote from the central office of the service provider. An objective of the service providers is to install and maintain these remotely located components for minimal costs yet maintain a highly reliable level of service from the electronics which typically have operational service lives exceeding 20 years. For utility and economic reasons, it is desirable to deploy remote electronic components outdoors in closed or sealed enclosures. Examples of the deployment of these electronics in outdoor settings varies considerably but includes locations along rural highways, along limited right-of-ways, and on metropolitan building rooftops.

Remote enclosures often house electronics having higher-power demands and greater heat-generation than earlier enclosures. Accordingly, the heat generated by each component, more so by the active than passive components, directly affects the performance of the components in the system. Since these components are generally encased or sheltered in a closed or sealed enclosure, removing the accumulated heat generated from the electronic components before a significant build-up occurs, is highly desired. Additionally, controlling the interior water vapor, in the heated air, and reducing the possibility of condensation in conjunction with the possibility of changing air temperatures inside the enclosure, has proved to be a particularly difficult problem.

There are numerous known ways of removing the heat generated within enclosures housing electronic components and circuits. However attempts to address the removal of accumulated heat in the enclosures have not been fully satisfactory. Further, attempts to prevent condensation within the enclosure occurring during power failure, for instance, have also proved generally unsatisfactory.

The failure of remotely-located electronic components can result from a range of uncontrolled or uncontrollable events including accidents, lightning strikes, power loss, vandalism, component failure, excess temperature and water vapor, i.e., humidity and condensation. Electronic units may also fail when the air temperature inside the enclosure exceeds the operational thermal limits of the electronics so that the electronics will shut down or fail. Upon operational failure, the units cool, the heated air cools such that the temperature inside the enclosure drops below the dew point, and the water vapor in the air condenses. When the failure is corrected (e.g., when power is restored) the units are again energized and will often fail due to short-circuiting occurring as a result of condensate on the energized components.

Accordingly, there exists a need to economically and simply establish and maintain the operation of electronic systems located in an enclosure during modes of operation and power failure. There exists a need to adsorb water vapor from the enclosure atmosphere during high humidity conditions and release collected water into the enclosure atmosphere as water vapor during low humidity conditions, without requiring high maintenance for the system. There exists a need to further provide low-maintenance means which are functional to provide continued operation of the electronic units before, during, and following power losses to the system.

The present invention provides a low-maintenance solution having apparatus capable of adsorbing and releasing water vapor in relation to the dew point temperature of the enclosure air in which an enclosure with heat-generating electronics is operative or undergoes power failure. The invention is further capable of reducing the likelihood of condensate forming on enclosed electronics and of regenerating its adsorptive characteristics. The invention also adaptably maintains and controls the water vapor in the enclosure during normal operational mode and in the event of power failure, virtually eliminates the likelihood of condensation on the enclosed electronic components. Frequently, and hereinafter, components of the invention are referred to as a sorption device. The sorption device has the ability to adsorb water vapor and release adsorbed water as vapor in response to the temperature within the enclosure in relation to the dew point. Further objects and advantages of this invention will become apparent from the detailed description which follows.

SUMMARY OF THE INVENTION

The present invention provides an enclosure for housing heat-generating operational electronic equipment, and a heated sorption device. The enclosure is exposed to external environmental atmospheric conditions. The sorption device functions in combination with a heater to maintain an internal atmosphere within the enclosure substantially devoid of condensation.

The sorption device is capable of adsorbing water vapor condensing in the surrounding atmosphere in response to the temperature within the enclosure falling below the dew point. This may occur during normal operations or in the event of power failure. Adsorption of water vapor occurs when the vapor pressure of the water in the sorption device is lower than the partial pressure of water vapor in the enclosure air. The sorption device also lowers the dew point of the air in the enclosure by reducing the humidity in the enclosure through the adsorption of water vapor.

The sorption device and the heater are also capable of desorbing water present in the sorption device as water vapor when the temperature of the sorption device is raised by the heater. This function is performed in response to the vapor pressure of the adsorbed water being greater than the partial pressure in the surrounding atmosphere (e.g. at the time of the restoration of power following a power failure). The term "desorb", as used herein, indicates that water vapor previously adsorbed is returned to the enclosure atmosphere in a vapor form, and is synonymous with the term "release", also used herein.

In this manner the humidity, and hence the condensation, within the housing is maintained at levels acceptable for the continued operation of electronics during operation, and during and after power failures. At atmospheric pressure, the sorption device is able to adsorb water vapor or release adsorbed water as vapor in relation to dew point conditions within the enclosure thereby regenerating itself without requiring frequent maintenance.

The sorption device may comprise one or more sorbent materials having high adsorptive capacity under normal atmospheric conditions, a desirable weight per unit volume to limit excessive bulk size, and a reasonable cost. The materials are preferably also chemically stable, substantially resistant to breakdown from handling, capable of reactivation at temperatures of about 10 to 30 degrees Centigrade above the operating temperature limits of the electronics, and heat-stable at reactivation temperatures. The sorption device is preferably solid but may also be in the form of beads or granules. The sorption device may also be packaged in kraft paper or other containable forms. The material of the sorption device preferably has a porous structure of sub-microscopic dimensions to provide extensive surface area.

It has also been considered that the sorption device may undergo chemical interactions during adsorption or desorption, in relation to the composition, saturation and temperature of the sorption device within the enclosure. During adsorption of water vapor, the sorption device may also undergo an exothermic reaction in which heat is released into the air of the enclosure. Additionally, the sorption device preferably "holds" water adsorbed as water vapor through weak attractive forces (e.g. Van der Waals' forces). Accordingly, the application of heat to the sorption device breaks the Van der Waals' forces and causes the sorption device to release the adsorbed water and regenerate the sorbent materials.

The heater is adaptively arranged in contact with the sorption device such that the thermal output generated by the heater is transferable to the sorption device for heating.

In accordance with one aspect of the present invention, the invention further comprises a temperature sensor which determines the temperatures of the air within the enclosure and the temperature of the sorption device. In another aspect of the present invention, the enclosure of the system is sealed.

These and other objects, features and advantages of the present invention will become apparent from the following detailed description and accompanying drawings.

BRIEF DESCRIPTION OF THE DRAWINGS

The invention, together with its various features and advantages, can be readily understood from the following more detailed description taken in conjunction with the Figure herein below.

DETAILED DESCRIPTION OF THE INVENTION

Figure 1:
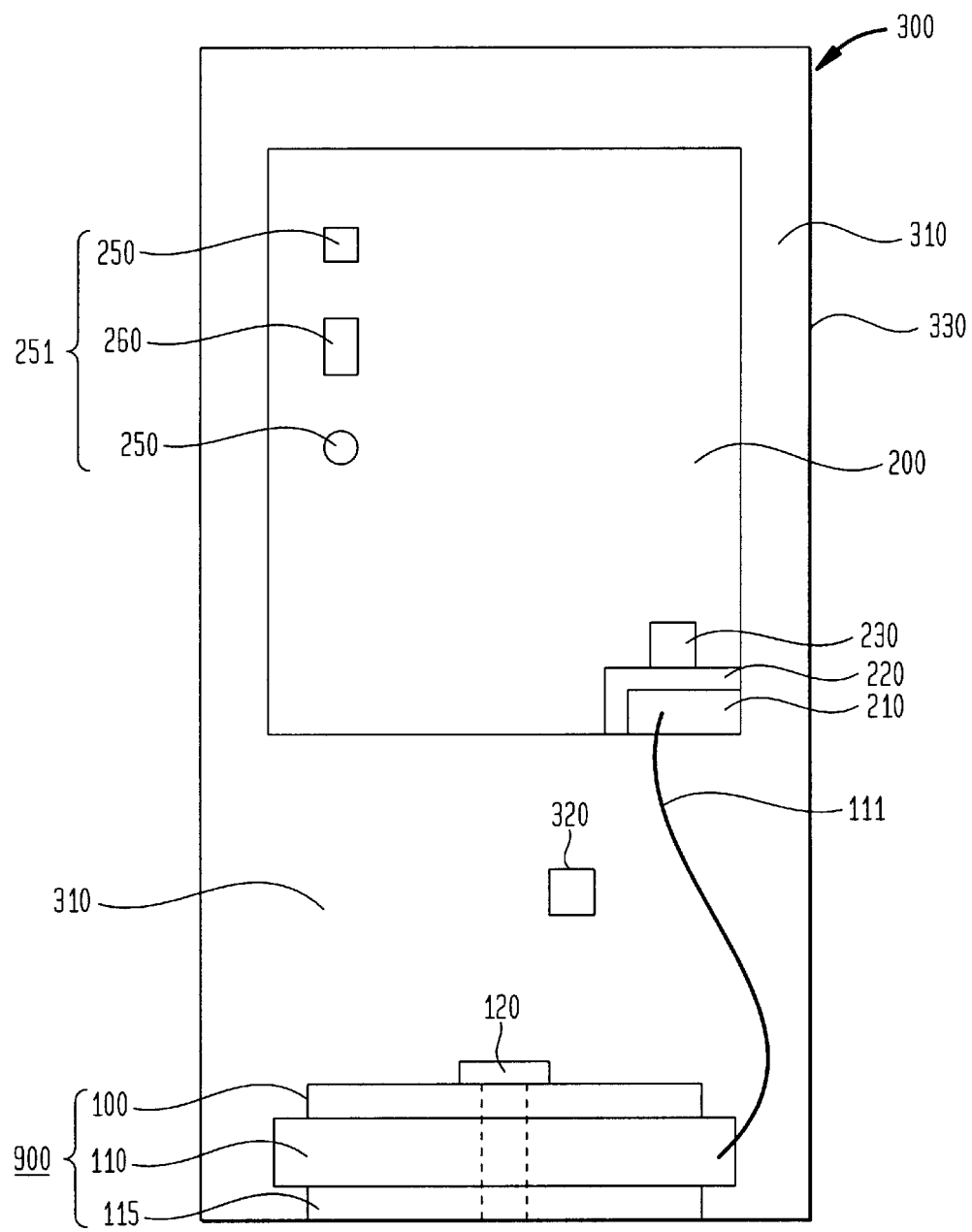
FIG. 1 is a diagram of a preferred embodiment of the present invention.

The preferred embodiment of the present invention and its advantages are best understood by referring to the drawing.

FIG. 1 depicts a diagrammatic view of a system 101 in accordance with the present invention under normal atmospheric conditions. The sorption device 100, the heater 110, and an electronic circuit board 200 are located within the enclosure 300. The sorption device 100 is able to adsorb water vapor, when the temperature of the surrounding interior is at or below the dew point, and release adsorbed water when the temperature of the surrounding interior is at or above the dew point. Preferably the sorption device 100 is comprised of a sorbent material. The heater 110 preferably includes a heating element (not shown) and insulating base 115. The sorption device 100, the heater 110, and insulating base 115 are herein cumulatively referred to as apparatus 900. The enclosure 300 is preferably devoid of openings or vents, yet is able to a maintain a pressure equalization between the interior pressure of the enclosure 300 and the external atmospheric pressure. The enclosure 300 may, however, also include the use of vents as the presence of small ventilation apertures may not detrimentally affect the rate at which water vapor is exchanged between the external and internal environments. Additionally, it is preferred that the enclosure 300 can be assembled and taken apart to allow the insertion of components or to facilitate repairs. Preferably, the enclosure 300 is closed or sealed for operational use. The enclosure 300 has the presence of air 310 in addition to the other features listed herein.

The sorption device 100 is placed onto a heater 110 such that the sorption device 100 is in contact with the heater 110. Preferably, the sorption device 100 is securely arranged in place with the heater 110 by a fastener 120 or by any other device commonly known or used in the art. The fastener 120 preferably secures the sorption device 100 and the heater 110 to a location inside the enclosure 300. The insulative base 115 provides protection to the enclosure 300 wall.

The heater 110 has a power source connection 111. Preferably, the heater 110 requires low voltage through its power source connection 111. Preferably, the power source connection 111 is a wire harness. The power source connection 111 is connected to the electronic circuit board 200, preferably at a location where power from the circuit board 200 may be received without interruption to the circuitry. To accommodate such a location, the board 200 preferably, has a power take-off connector 210. The power take-off connector 210 has a power supply path 220 which is the connection of the power take-off connector 210 to the power source 230 on the circuit board 200. Since the apparatus 900 uses low voltage, it is preferred that no additional power source be supplied within the enclosure 300 since the apparatus 900 preferably uses a small amount of current from the power source already present within the enclosure 300.

The electronic circuit board 200 includes electronic components 250, and preferably at least one active component 260. The electronic components 250 and active component 260, hereinafter cumulatively referred to as electronic components 251, may include, by way of example but not of limitation, resistors, capacitors, transformers, circuit protection devices, electro-optical devices, microprocessors, switches, circuit boards, active electronics, passive electronics, and the like. Examples of active electronics include multiplexers, filters, encoder circuits and decoder circuits. The electronic components 251 may be indoor-grade or outdoor-grade electronic components. The power take-off connector 210 may also be detached from the board 200 and located elsewhere within the enclosure 300.

When the electronic circuit board 200, also referred to as a unit 200, is operational, heat is generated from the components 251 resident on the board 200. Heat generated from the components 251 rises into the open spaces of the enclosure 300 and causes the ambient air 310 to increase in temperature. During operation, power is preferably supplied to the unit 200 and a small voltage is diverted from the board 200 to the power take-off connector 210 through the power supply path 220.

The heater 110 is heated from the voltage received from the power take-off connector 210. The heater 110 is preferably a good conductor of heat such that the sorption device 100 which is in contact with the heater 110 is thereby heated.

The sorption device 100 is preferably heated to maintain a temperature of the sorption device 100 which is higher than the air 310 temperature or which exceeds the operational temperature limits of the components 251. Preferably, the temperature of the ambient air 310 and the heater 110 are monitored by a temperature sensor 320. Preferably the humidity of and the temperature in the enclosure interior may be monitored concurrently by the same sensor 320. The temperature sensor 320 may be a temperature sensing device such as a thermistor, and is preferably part of the unit 200.

The sorption device 100, during normal operations, is heated by the heater 110 to a temperature of about 10–30 degrees Centigrade higher than the temperature of the ambient air 310 within enclosure 300. During operation at this temperature, the ability of the sorption device 100 to adsorb water vapor is decreased due to the characteristics of the sorption device 100. However, the sorption device 100 will likely adsorb some water vapor at this operating temperature, which remains substantially constant during normal operation. Upon power failure, for example, the sorption device 100 remains at a temperature higher than the ambient air 310, although both begin to cool subsequent to the power failure. As the sorption device 100 cools, its ability to adsorb water vapor increases and the vapor pressure of the water vapor inside the ambient air 310 becomes lower than the vapor pressure of the water in the sorption device 100. As the sorption device 100 approaches atmospheric temperature conditions, the ability of the sorption device 100 to adsorb water vapor is optimized. At this stage, under atmospheric pressure, the water vapor in the atmosphere may continue to condense with the falling temperature of the ambient air 310 as it remains below the dew point (the temperature at which water vapor condenses from the air). The sorption device 100 may then continue to adsorb water vapor until it nears saturation, until the temperature of the ambient air 310 is at or above the dew point, or until the humidity in the ambient air 310 is lowered to a level that lowers the dew point below the ambient air 310.

Upon the resurgence of power, the sorption device 100 is heated and releases the collected water as water vapor once the ambient air 310 temperature is heated, by the heat-generating components 251, to a temperature which is at or above the dew point. In effect, the sorption device 100 is reactivated by the heater 110 and is able to effectively regenerate itself such that it is able to continue to adsorb water vapor or release water as water vapor, as needed, within the enclosure 300.

For example, a 4.5 gram package of silica gel can adsorb approximately 1 gram of water vapor at 75° F. and 50% relative humidity. Upon heating to 100° F., the gel can absorb only approximately 0.5 grams of water vapor. When heating is discontinued, however, and the gel package begins to cool to 75° F., the gel can then adsorb the remaining 0.5 grams of water vapor. When heat is reapplied, the gel begins to release the previously adsorbed water. Silica gel may be used as the sorption device 100. The sorption device 100 is able to therefore cycle between adsorbing and releasing water vapor as necessary.

The sorption device 100 is preferably comprised of a solid adsorbent material having a thermal mass, which is capable of adsorbing and releasing water molecules in relation to the dew point of the ambient air 310. A variety of adsorbing materials are able to undergo absorption and desorption under certain conditions depending on the physical characteristics of the material, thereby buffering the relative humidity within an enclosure until the material becomes saturated.

To achieve a complete desorption of the sorption device 100, the sorption device 100 must typically reach temperatures greater than about 140 degrees Centigrade. To achieve complete effectiveness of the sorption device 100, the sorption device 100 preferably maintains the dew point below about −50 degrees Centigrade. However, neither a complete desorption of collected water nor use of a sorption device 100 in a completely effective manner is necessary to practice the invention.

In the present invention, since the sorption device 100 is heated to a temperature of about 10–30 degrees Centigrade greater than the ambient air 310, the water vapor generally remains in the ambient air 310 without forming condensate as it is of a lower pressure than that of the vapor pressure of the sorption device 100. In the event some condensate is formed, the sorption device 100 is able to adsorb such condensation. During operation, the sorption device 100 typically does not adsorb a significant amount of water vapor due to the temperature and vapor pressure differences between the sorption device 100 and the ambient air 310. Therefore, the sorption device 100 is essentially "preserved" until it is actually needed (e.g. in the event of a power failure). Due to the heater 110, the sorption device 100 is heated and is able to maintain a relative humidity in the enclosure which can permit operation of the electronics even where the humidity is about 100%, thus establishing an improved operational environment at temperatures which may approximate the limits of the electronics 251. The surfaces of the electronics, while operating, are generally hot and at a temperature greater than the dew point. Consequently, condensation of water vapor on the electronics will likely not occur even at humidity of 100%.

The heater element 110 also enables the sorption device 100 to have a longer operational life requiring less servicing since it is able to effectively regenerate the sorption device 100 by heating. Preferably, the heater 110 requires only a small amount of power, generally less than about 30% of that used by the electronics 251.

Typically, electronic operational thermal limits maybe about 110 degrees Centigrade. Since, in certain situations, the sorption device 100 is heated to about 10–30 degrees above the operational limit, the sorption device 100 is able to effectively "dry-out" without being serviced. However, even when the ambient air 310 temperatures remain in a range below the operational limits, heating of the sorption device 100 to a higher temperature, restores the adsorptive capabilities of the sorption device 100. Similarly, due to the preservation of the use of the sorption device 100 a longer service-life of the sorption device 100 is achieved.

The size of the sorption device 100 is variable based upon factors including the available space in the enclosure 300, the thermal mass of the sorption device material selected and the amount of heat generated by the electronic components 251 operating in the enclosure. Preferably, the sorption device 100 is of a size which does not require a substantial thickness. Preferably, the sorption device 100 is comprised of a material having a moderate to high thermal mass value so that the thickness and surface area of sorption device required can be minimized in the enclosure 300. The sorption device 100 of the present invention can also be comprised of materials having a lower thermal mass, since the sorption device 100 operates at a temperature higher than the ambient air 310.

Accordingly, the sorption device 100 for the invention preferably includes solid adsorbent materials which may be natural or synthetic. The sorption device 100 preferably does not liquify when heated to temperatures of about 150 degrees Centigrade and higher. Sorption device 100 preferably includes adsorbent material like silica gels, clays, ion exchange resins and zeolites, activated alumina, activated bauxite, activated carbon, calcium sulfate, calcium oxide, alkaline earth salts like calcium or magnesium, inorganic acids like sulfuric acid, hydrochloric acid, oxides of such alkaline earth salts and gypsum, in the forms previously described and has weak Van der Waals' forces for adsorbing water molecules.

Silica gels which can be used with the invention include silica gels from amorphous silicon gel ($SiO_2$) synthesized from sodium silicate which can be completely reactivated at temperatures up to about 300 degrees Fahrenheit and includes indicating silica gels. Examples of commercially available indicating silica gels include Sorb-It® by United Desiccants of New Mexico.

The clays which can be used with the invention includes clays of the smectite group, such as montmorillonite and bentonite, which are natural calcium or magnesium aluminosilicates, and indicating clays. An example of a commercially available clay sorbent is Desi-Pak® from United Desiccants of New Mexico.

The zeolites which can be used with the invention include molecular sieves which consist of sodium, potassium, calcium, or magnesium alumino-silicates, and the naturally occurring minerals of chabazites and clinoptilonites.

Activated alumina which can be used with the invention include materials of partially dehydrated aluminum trihydrate containing soda, iron oxides, silicon and titanium, and adsorbents produced by sorption precipitation from a sodium aluminate solution resulting from the extraction of alumina from bauxite by the Bayer process.

Activated bauxite which can be used with the invention includes materials consisting primarily of $Al_2O_3$, $Fe_2O_3$, $SiO_2$, $TiO_2$, and $H_2O$, in varying percentages.

Any blends of mixtures of the above described materials can also be used in the invention.

Preferably, a solid silica gel is used as the sorption device 100 (in a "bean bag"), capsule, indicator container, kraft paper, disk form or other container-like package commonly known or used in the art. The sorption device 100 can be of any shape to accommodate the limited physical space available within the enclosure 300. The location of the sorption device 100 within the enclosure 300 is preferably at a location conducive to improved space utilization. It is preferred that the sorption device 100 be located near the components 251. Similarly, the shape of the heater 110 is preferably adapted to the shape of the sorption device 100 to provide uniform heating of the sorption device 100.

The enclosure 300 provides the protection to the electronic components 251 from the external environment and usually prevents the system from dissipating heat. Accordingly, the enclosure 300 is preferably constructed of a material being moisture-proof, resistant to the temperatures of the ambient air 310 within the enclosure 300, and resistant to the environmental temperatures and conditions the external faces 330 of the enclosure 300 are exposed to. The enclosure 300 also preferably has means for opening, closing, securing, locking and sealing. Preferably, the enclosure 300 is insulated. The enclosure 300 may also be constructed of materials having lower insulative properties and/or less physical material, due to the presence of the heated sorption device 100, than conventional enclosures. Preferably, the material of the enclosure 300 is lightweight and of a relative thickness permitting ease of transport and access for repair.

The ambient air 310 within the enclosure 300 is usually air from the environment in which the electronics 251 were installed into the enclosure 300 (e.g., at a remote location prior to closing or sealing the enclosure 300). The ambient air 310, may be air from the controlled environment of a clean room or a manufacturing location which first assembled the enclosure 300 with its components 251 prior to placing the assembly into remote field service. Additionally, the ambient air 310 may be evacuated such that the components 251 are placed within a vacuum chamber. For a vacuum chamber, the enclosure 300 is constructed of a material which is able to withstand the additional pressures created from the vacuum.

As used herein the term "adsorbent" is a material which does or does not change physically or chemically during the sorption process, which includes the cycle of adsorbing water vapor from the surrounding air and desorbing, or releasing, adsorbed water to the surrounding air, in response to the temperature of the surrounding air in relation to the dew point.

As used herein the term "atmospheric" indicates conditions which are near or approximate normal atmospheric conditions such as about 21 to 22 degrees Centigrade and a relative humidity of about 38 to 64 percent.

As used herein the term "relative humidity" is the amount of moisture in the air compared to the maximum amount the air can hold at a temperature measured with a dry sensing bulb. The measure is a relative amount as the maximum humidity varies with temperature since warm air can "hold" more moisture than cold air.

As used herein the term "sorption" is the assimilation of molecules of one substance by a material in a different phase and includes the phases adsorption (sorption on a surface), absorption (sorption into bulk material) and desorption (release into surrounding air from surface or bulk material) as components of the sorption cycle.

The invention has other possibilities such as: the enclosure is not under normal atmospheric conditions; the enclosure is sealed; the air within the enclosure is in vacuum; and the enclosure is indoors or within a secondary housing. It is evident that the invention is suitable for operation under these and other conditions since the sorption means adjusts to the conditions within the enclosure. It is also obvious that the sorption means may be selected for specific operating conditions.

The invention has been described with respect to the aforementioned preferred embodiments. Modifications obvious to the ordinary skilled artisan are intended to be within the scope of the invention, and it will be clear to those artisans that many modifications can be made therein without departing from the spirit and scope of the invention.

What is claimed is:

1. An enclosure for housing electronics, comprising:
   a sorption device responsive to heat and capable of adsorbing water vapor from air within the enclosure and releasing water vapor within the enclosure; and
   a heater capable of generating a thermal output transferable to the sorption device, wherein the sorption device is heated to a temperature above the temperature of the air in the enclosure.

2. The enclosure of claim 1, wherein the sorption device includes one or more materials selected from the groups consisting of silica gels, zeolites, ion exchange resins, and clays.

3. The enclosure of claim 2, wherein the materials are a solid.

4. The enclosure of claim 1, wherein the sorption device includes one ore more materials selected from the group consisting of silica gel, clay, ion exchange resin, zeolite, activated alumina, activated bauxite, activated carbon, calcium sulfate, calcium oxide, alkaline earth salt including calcium or magnesium, inorganic acid including sulfuric acid and hydrochloric acid, oxides of alkaline earth salts and gypsum.

5. The enclosure of claim 1, further comprising a sensor capable of regulating the temperature of the sorption device in relation to the temperature of the air by adjusting the thermal output of the heater.

6. An enclosure for housing electronics, comprising:
   a sorption device responsive to heat and capable of adsorbing water vapor from air within the enclosure; and
   a heater capable of generating a thermal output transferable to the sorption device, wherein the sorption device is heated to a temperature in the range of about 10° C. to 30° C. higher that the temperature of the air in the enclosure.

7. An enclosure for housing electronics, comprising:
   a sorption device responsive to heat and capable of adsorbing water vapor from air within the enclosure;
   a heater capable of generating a thermal output transferable to the sorption device; and
   a sensor capable of regulating the temperature of the sorption device in relation to the temperature of the air by adjusting the thermal output of the heater, wherein the sensor measures the temperature of the air and the temperature of the sorption device, and adjusts power to the heater to increase or decrease the sorption device temperature to, or maintain the sorption device temperature at a temperature in the range of about 10° C. to 30° C. above the temperature of the air in the enclosure.

* * * * *